(12) United States Patent
Drews et al.

(10) Patent No.: US 6,642,553 B1
(45) Date of Patent: Nov. 4, 2003

(54) BIPOLAR TRANSISTOR AND METHOD FOR PRODUCING SAME

(75) Inventors: Juergen Drews, Frankfurt an der Oder (DE); Bernd Tillack, Frankfurt an der Oder (DE); Bernd Heinemann, Frankfurt an der Oder (DE); Dieter Knoll, Frankfurt an der Oder (DE)

(73) Assignee: Institut fuer Halbleiterphysik Frankfurt (Oder) GmbH., Frankfurt an der Oder (DE)

( * ) Notice: Subject to any disclaimer, the term of this patent is extended or adjusted under 35 U.S.C. 154(b) by 0 days.

(21) Appl. No.: 09/787,680

(22) PCT Filed: Sep. 20, 1999

(86) PCT No.: PCT/DE99/03073

§ 371 (c)(1),
(2), (4) Date: Mar. 22, 2001

(87) PCT Pub. No.: WO00/17934

PCT Pub. Date: Mar. 30, 2000

(30) Foreign Application Priority Data

Sep. 21, 2000 (DE) ......................................... 198 45 789

(51) Int. Cl.[7] ............................................. H01L 31/072
(52) U.S. Cl. ....................... 257/197; 257/257; 257/198; 257/200; 257/580
(58) Field of Search ................................. 257/197, 198, 257/200, 580, 588; 438/202, 234, 235, 313, 340

(56) References Cited

U.S. PATENT DOCUMENTS

| 5,137,840 | A | | 8/1992 | Desilets et al. ............... 437/32 |
| 5,552,617 | A | * | 9/1996 | Hill et al. .................... 257/197 |
| 5,604,374 | A | | 2/1997 | Inou et al. ................... 257/593 |
| 5,668,396 | A | | 9/1997 | Sato ............................. 257/517 |
| 5,798,561 | A | * | 8/1998 | Sato ............................. 257/580 |
| 5,930,635 | A | * | 7/1999 | Bashir et al. ................ 438/309 |
| 6,020,246 | A | * | 2/2000 | Koscielniak et al. ........ 438/341 |
| 6,100,124 | A | * | 8/2000 | Iwamoto ...................... 438/202 |

FOREIGN PATENT DOCUMENTS

WO    WO 90/09678    8/1990    ........... H01L/21/82

* cited by examiner

*Primary Examiner*—Hoai Ho
*Assistant Examiner*—Dao H. Nguyen
(74) *Attorney, Agent, or Firm*—Karl Hormann (57) ABSTRACT

The invention relates to a bipolar transistor and a method for producing same. The aim of the invention is to provide a bipolar transistor and a method for producing same, which during the use of a single-process poly-silicon technology with differential epitaxis for the production of bases overcomes the disadvantages of conventional systems, so as notably further to improve the high-speed properties of a bipolar transistor, provide the most conductive connections possible between the metal contacts and the active (internal) transistor region as well as a minimized passive transistor surface, while at the same time avoiding greater process complexity and increased contact resistances. To this end a surface relief is produced in the active emitter region by a wet-chemical process. A single-process poly-silicon bipolar transistor having a base produced by epitaxis in accordance with the invention permits a reduction in external base resistance without causing a deterioration in emitter properties. Because the internal and external base regions are deposited continuously no interface problems arise during connection of the base. Base-collector capacity can also be lowered.

21 Claims, 6 Drawing Sheets

BIPOLAR TRANSISTOR AND METHOD FOR PRODUCING SAME

BACKGROUND OF THE INVENTION

1. Field of the Invention.

The invention relates to a bipolar transistor as well as to a method of its fabrication.

An important field of application of bipolar transistors are high speed applications. In order to improve the efficiency of transistors in the range of highest speeds, the influence of parasitic components, i.e. resistances and capacitances, must be reduced. For this reason, not only are conductive connections, if possible, required between the metal contacts and the active (internal) region of the transistor but also a minimized passive transistor surface.

2. The Prior Art.

To satisfy these requirements, laterally scaled, so-called "double-process poly-silicon technologies" are used in modern methods of fabrication of vertical bipolar transistors. It is possible in such technologies to arrange the base contact and parts of the highly conductive poly-silicon connection between contact and internal base above insulated regions. A special arrangement of this kind in which the base has been fabricated epitaxially over an etched semiconductor region is described in U.S. Pat. No. 5,137,840. Relative to "single-process poly-silicon technologies" these structural advantages unfortunately entail such drawbacks as additional processing complexity and heightened contact resistances. These drawbacks are rooted in the required etching of the poly-silicon in the active transistor region as well as in the out-diffusion of the dopants from the highly doped poly-silicon layer into the monocrystalline base connection region. Since the poly-silicon for the base connection region over the active transistor region is removed by dry etching techniques and since there is no selectivity as to the monocrystalline silicon therebelow, the exposed silicon surface is likely to be damaged. Surface roughness, malfunctions of the lattice structure and penetration of foreign substances are the result.

There have been a variety of proposals to overcome these problems. For instance, etch stop layers are used to protect the emitter region in order to solve problems during dry etching. Additional efforts are needed to ensure a self-adjustment of emitter region and etch stop layer.

Lately, it has been possible further to improve the high speed characteristics by the use of epitaxial processes. To this end use is made of in situ doping during precipitation to achieve small base widths, i.e. small thicknesses of the base layers and low base layer resistances.

A further degree of freedom during setting of the base resistance and current amplification and, hence, optimization of the high speed characteristics is obtained by the precipitation of hetero layers.

The concept of double-poly-silicon technology including etch stop layer has also been realized in the case of epitaxially incorporated base layers by so-called selective epitaxy. In epitaxy that epitaxial growth on exposed semiconductor surfaces only is ensured by the conditions of precipitation. If differential epitaxy is used during which silicon material is precipitated on semiconductor as well as insulating regions, it is possible simultaneously to produce the internal base and the connection to a base contact positioned in an insulating region (base connection region). In general, this avoids the need for an additional poly-silicon layer. The resultant quasi double-poly-silicon arrangement makes it possible to simplify the process.

However, compared to a complete double-poly-silicon process one is confronted by the disadvantage of it not being possible to set the thickness of the epitaxial layer in the active transistor region independently of the thickness of the silicon layer. For two different requirements exist as regards the thickness of the epitaxial layer. That is to say that within the active emitter region the layer thickness between the highly doped emitter and the base should be sufficiently thin. In the outer base region a greater thickness is advantageous to provide a low resistance base connection. In order simultaneously to satisfy these opposing requirements, recourse may be had to increasing the thickness of the epitaxial layer above the base (cover thickness) in connection with a selective implantation in the active emitter region. Without appropriate measures the annealing of implantation damage, for instance in the case of epitaxially produced doping of the base in a silicon-germanium layer, leads to an unacceptable widening of the base profile, however. If the cover layer is doped in situ, undesired consequences result in respect of the conventionally used poly-emitter structures: An emitter zone of reduced conductivity or even reduced charge carriers is the usual result below the passivation between the margin of the emitter and the highly doped base connection. This may lead to a deterioration of the static as well as dynamic characteristics of the transistor. A thicker buffer layer between substrate and base may provide partial relief if in situ doping of the collector doping kind is incorporated during epitaxy.

Aside from process related technological difficulties, this variant suffers from the disadvantage, among others, of subsequent redoping of the buffer layer outside the active transistor increasing the base-collector capacitance.

OBJECTS OF THE INVENTION

It is an object of the invention, to propose a bipolar transistor and a method of its fabrication by which, in a single-process, poly-silicon technology using differential epitaxy to produce the base, the described disadvantages of conventional arrangements are overcome, thereby further improving the high speed characteristics in particular, providing connections as conductive as possible between the metal contacts and the active (internal) transistor region as well as a minimized passive transistor surface, while at the same time avoiding additional process complexity and increased contact resistances.

BRIEF SUMMARY OF THE INVENTION

In accordance with the invention the object is accomplished by precipitating a cover layer (17, 119) or a combination of layers (117, 118, 119) over the base layer (16, 116) and complete or partial removal thereof by means of a partial mask in the active emitter region, whereby a surface relief is wet-chemically formed in the active emitter region.

A single-process poly-silicon bipolar transistor with an epitaxially produced base in accordance with the invention makes reduced external base resistances possible without deterioration of the emitter characteristics. As a result of the uninterrupted precipitation of internal and external base region no interfacial problems occur at the base connection. Moreover, the base-collector capacitance can also be reduced.

An additional in situ doping or hetero layer sequence in the cover over the precipitated base layer offers further advantages. As etch stop layers such intermediate layers affect a balancing of thickness variations of the cover in the active emitter region.

An appropriate doping of the cover layer of the conductive kind of the base which in the active emitter is removed during re-etching of the cover leads to a reduced external base resistance. The self-adjusting arrangement makes possible a low-ohmic base connection free of implantation damage up to very small emitter widths. Moreover, such additional doping of the base connection makes possible smaller distances between the active emitter region and to siliconize the base connection.

DESCRIPTION OF THE SEVERAL DRAWINGS

The novel features which are considered to be characteristic of the invention are set forth with particularity in the appended claims. The invention itself, however, in respect of its structure, construction and lay-out as well as manufacturing techniques, together with other objects and advantages thereof, will be best understood from the following description of preferred embodiments when read in connection with the appended drawings, in which:

DETAILED DESCRIPTION OF THE PREFERRED EMBODIMENTS

Example 1

The invention will now be described in connection with a single-process poly-silicon method with an epitaxially produced base. Modifications of this process, such as, for instance, hetero epitaxy, or incorporation in a bipolar CMOS-technology (BiCMOS) are also possible.

Figure 1:
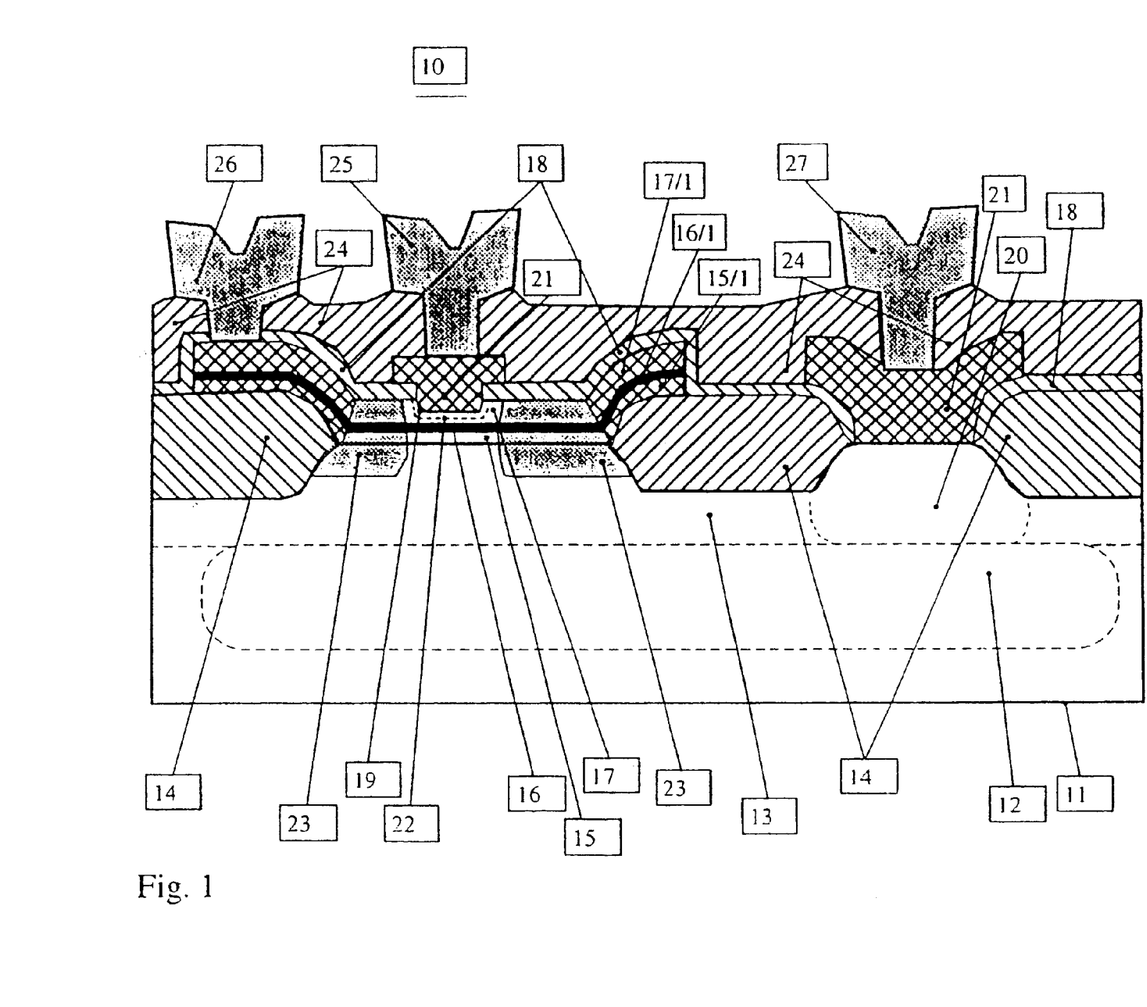
FIG. 1 is a schematic presentation of a bipolar transistor.

FIG. 1 schematically depicts a bipolar transistor 10 in accordance with the invention. On the semiconductor substrate region 11 of circuit type I there has been fabricated a collector region of circuit type II. Where emitter and collector are, for instance, n-conductive, the base will be p-conductive, and vice versa. Several methods have become known for providing suitable collector doping. Among these are, for instance, the structure shown in FIG. 1 with a highly doped buried layer 12 and a less doped epitaxial layer 13, as well as implanted retrograde wells. In the embodiment here shown, a field insulating region 14 separates the bipolar transistor from other components not shown in FIG. 1, as well as the collector connection region from the active transistor region. Other suitable technologies are also known, such as, for instance, spaced mesa arrangements. A buried implant 20 may optionally be incorporated to reduce the resistance between the contact layer 21 consisting of highly doped poly-silicon and the buried layer 12.

A sequence of epitaxial layers consisting of a buffer layer 15, in situ doped base layer 16 of circuit type I as well as a cover layer 17, covers the emitter region in the active transistor area and at least a part of the insulating region. The epitaxial layer structured outside of the active transistor region is covered by a non-conductive material 18. While the buffer layer 15 is a possible component, it is not essential for purposes of the present invention. The specific values of thickness, dopant content as well as material composition of the base are to be selected according to the requirements of function of the bipolar transistor and in terms of the invention are not subject to any special requirements. In the described example the base layer consists of silicon, is p-doped with $2 \cdot 10^{18}$ cm$^{-3}$ and is assumed to have thickness of 40 nm. Other material compositions and doping profiles may also be used. In terms of the invention, the use of a cover layer 17 above the base is essential. In the active emitter region it is partially or completely removed. Doping of the emitter in the monocrystalline silicon is ensured by outdiffusion of dopant 22 from the highly doped poly-silicon contact layer 21. The precipitated thickness of the cover layer may typically be 50 to 150 nm. A thickness of 100 nm is assumed to be the preferred value. The exact depth of the re-etched part 19 of the cover layer 17 depends upon the structure of the base doping and material composition as well as on the desired dopant profile at the base-emitter junction. In the described example there has been predetermined a remaining thickness of 50 nm for the cover layer. While the buffer, base and cover layers grow as monocrystals over the silicon substrate, polycrystalline layers 15/1, 16/1, 17/1 are formed over the insulating region 14. Outside of the poly-silicon contact layer 21 overlapping the active transistor region the doping of the base connection region has been additionally doped by implantation 23. The insulating layer 24 separates emitter, base and collector contact. The structure of the transistor is completed by metal contacts for the emitter 25, base 26 and collector 27.

Figure 2:
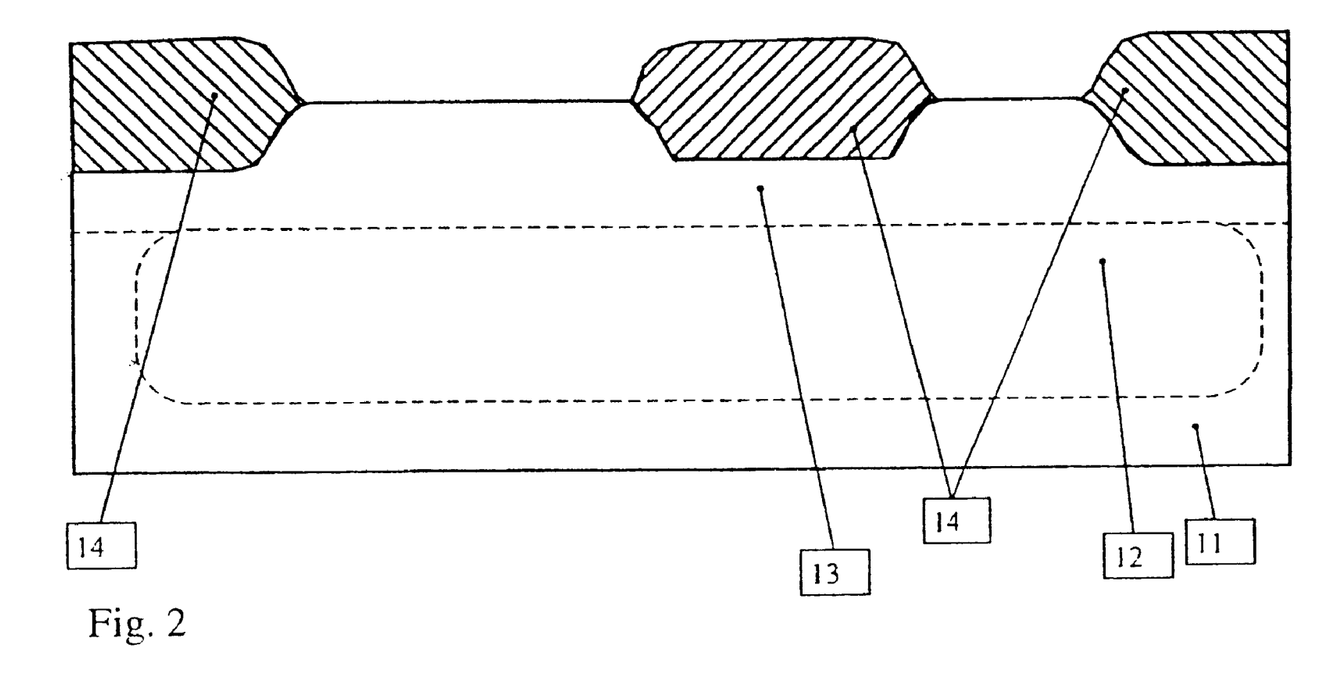
FIG. 2 is a schematic presentation of a bipolar transistor in accordance with FIG. 1 before epitaxy.

Hereafter, there will be described the fabrication of a bipolar transistor in accordance with the invention. The method in accordance with the invention proceeds from the structure before epitaxy shown in FIG. 2. After photolithographic structuring, a highly doped n-layer 12 is incorporated by implantation and annealed into p-doped silicon substrate 11. Thereafter, a weakly doped n-layer 13 is epitaxially precipitated. Conventional process steps define the active region and form insulating regions 14 (e.g. LOCOS) in the remaining regions.

Figure 3:
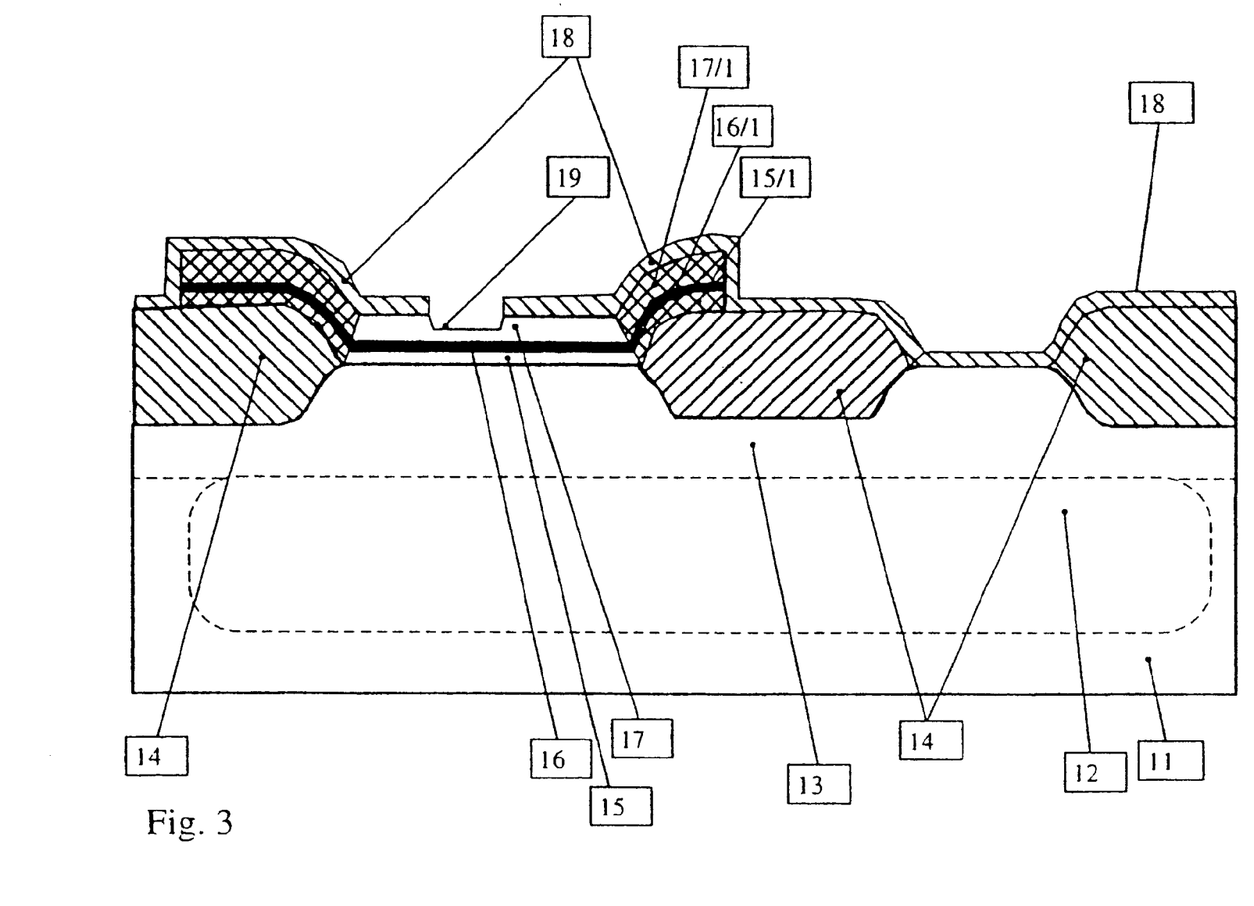
FIG. 3 is a schematic presentation of a bipolar transistor in accordance with FIG. 1 during fabrication.

The result of the ensuing process steps is shown in FIG. 3. Buffer layer 15, 15/1, base layer 16, 16/1 and cover layer 17, 17/1 are precipitated by means of differential epitaxy. They grow as monocrystals on the silicon region and as polycrystals on the insulating region. After photolithographic structuring of a mask, the precipitated silicon or poly-silicon layers on the insulating region outside of the subsequent transistor and base connection regions are removed with an etch stop by means of a plasma etching step. A subsequently applied dielectric substance 18, preferably an oxide, is initially opened in the emitter region by common lithographic or wet etching processes.

The surface relief shown in FIG. 3 may be produced by means of known wet chemical etching agents which remove silicon in a well-controlled and highly selective manner with respect to the masking dielectric substance. In this process, the cover layer in the active emitter region is partially or completely removed. The desired surface relief may, however, also be produced by opening a nitride mask over the precipitated layer sequence 15, 15/1; 16, 16/1; 17, 17/1 above the active emitter, subsequently converting the cover layer 17 partially or completely at thermal oxidation in SiO$_2$ and, finally, by wet-chemical removal of the oxide formed in the active emitter relative to the mask and etch stop on the monocrystalline silicon.

The collector connection region is now exposed by photolithographic structuring of a lacquer mask, and the buried implant is incorporated. Before removal of the lacquer mask, the oxide layer 18 in the collector connection region is also etched, preferably wet-chemically, as previously in the emitter region. The process continues by precipitation of an amorphous silicon layer. This layer may be doped by implantation in situ, during or after precipitation. Emitter and collector contact regions are masked by a lithographic step. In the remaining regions the amorphous silicon is removed by an etching step with a stop on the $SiO_2$ layer. During the following implantation of the base connection region the emitter and collector connection regions are protected by the present masking. After removal of this masking and covering of the formed surface with an oxide, tempering will take place for annealing implantation damage as well as for forming of the poly-emitter. The process is completed by opening the via holes for emitter, base and collector and a standard metallization for the transistor contacts.

Example 2

Figure 4:
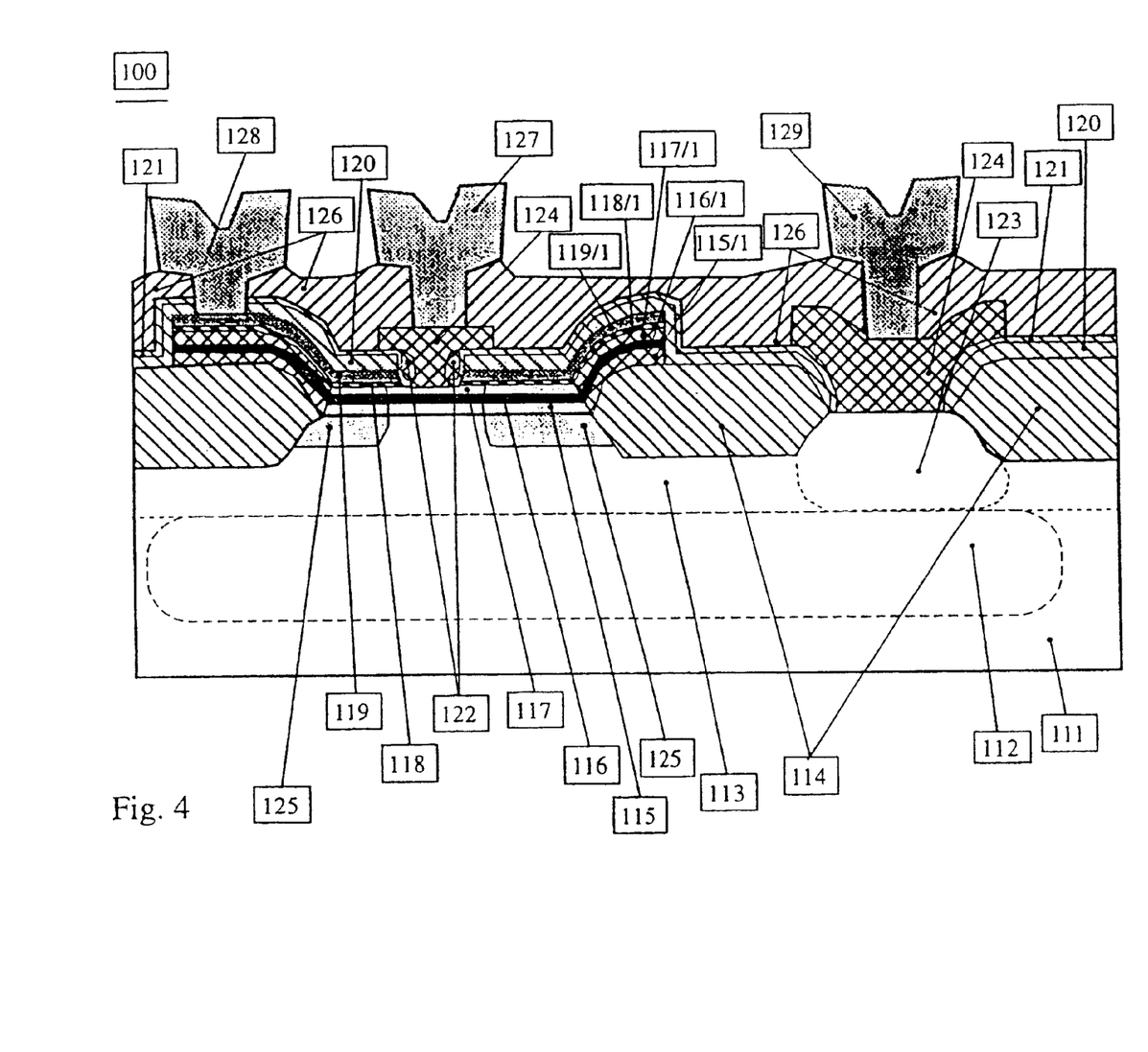
FIG. 4 is a schematic presentation of a bipolar transistor.

FIG. 4 depicts a second embodiment of a bipolar transistor 100 in accordance with the invention. In a manner similar to the first example, there has been formed a collector region of circuit type 11 on the semiconductor substrate region 111 of circuit type 1. Doping of the collector consists of a highly doped buried layer 112 and a lesser doped epitaxial layer 113. An insulating region 114 separates the bipolar transistor from other components not shown in the drawing as well as collector connection region from the active transistor region. A buried implant 123 may optionally be applied for reducing the resistance between the contact layer 124 made of highly doped poly-silicon and the buried layer 112.

A sequence of epitaxial layers consisting of a buffer layer 115, in situ doped base layer 116 of circuit type 1, the weakly doped intermediate layer 117, an etch stop layer 118 and, finally, a preferably doped cover layer 119 (of the circuit type of the base), covers the emitter region in the active transistor region and at least a part of the insulating region. While the buffer, base, intermediate, etch stop and cover layers grow in a monocrystalline manner, polycrystalline layers 115/1, 116/1, 117/1, 118/1 and 119/1 are formed over the insulating region 114. The epitaxial layer structured outside of the active transistor region is covered by a dielectric substance 120. The buffer layer is optional but not essential for purposes of the invention. The specific values as regards thickness, dopant content as well as material composition of the base are selected in accordance with requirements of the function of the bipolar transistor and in respect of the invention they are not subject to any special requirements. A highly doped silicon-germanium layer may be used, for instance. To prevent the outdiffusion of boron from the silicon-germanium layer, carbon may be appropriately incorporated in the base layer. Other material compositions and doping profiles may also be used for the base.

The application of the layer combination 117, 118 and 119 above the base layer 116 is to be considered essential to the invention, the cover layer 119 being completely and the etch stop layer 118 being completely or partially removed in the active emitter region. Immediately over the base there is a weakly doped intermediate layer 117. The thickness of this intermediate layer is selected so as to avoid tunneling currents between the high doping of base and emitter and advantageously to affect the dynamic transistor characteristics. The characteristics of the etch stop layer 118 and cover layer 119 are designed so that during etching of the cover layer 119 the selectivity relative to the stop layer 118 is sufficient. In addition, the etch stop layer is preferably designed so that it may itself be removed in a second etching step. In this manner it is possible strongly to dope the etching stop layer with the circuit type of the base layer in the same manner as the cover layer 119. These requirements may be satisfied by very strongly doping a silicon etching stop layer 118 with boron, especially more than $3 \cdot 10^{19}$ cm$^{-3}$ and by doping the superposed cover layer at boron concentration less than $10^{19}$ cm$^3$. It is also possible to achieve an etch stopping effect relative to the cover layer 119 by other material compositions of the etch stop layer 118, such as, for instance, silicon-germanium or carbon enriched silicon.

The precipitated thickness of the intermediate layer 117 may typically be between 30 and 50 nm. A preferred value may be assumed to be 40 nm. The thickness of the etching layer may be between 5 and 15 nm. A value of 10 nm is preferred. The thickness of the cover layer may be between 30 and 100 nm; a preferred value is assumed to be 50 nm. A sufficient lateral space between the preferably used high level doping of the etch stop layer 118 and cover layer 119 on the one hand and, on the other hand, the emitter doping formed by outdiffusion from the highly doped poly-silicon contact layer is ensured by the formation of an inside poly-silicon spacer 122. During fabrication of the inside spacer the $SiO_2$ insulating layer serves as an etch stop layer for the required plasma etching step. Outside of the poly-silicon layer 124 overlapping the active transistor range doping in the base connection region has been additionally increased by implantation 125. The accelerated diffusion originating from this implantation is preferably to be used for bringing about spreading of the doping incorporated in cover layer 119 and etch stop layer 118 in the direction of the base while spreading of the inner base layer is prevented by incorporation of carbon. The insulating layer 126 separates emitter, base and collector contacts. The transistor structure is completed by metal contacts for the emitter 127, base 128 and collector 129.

Figure 5:
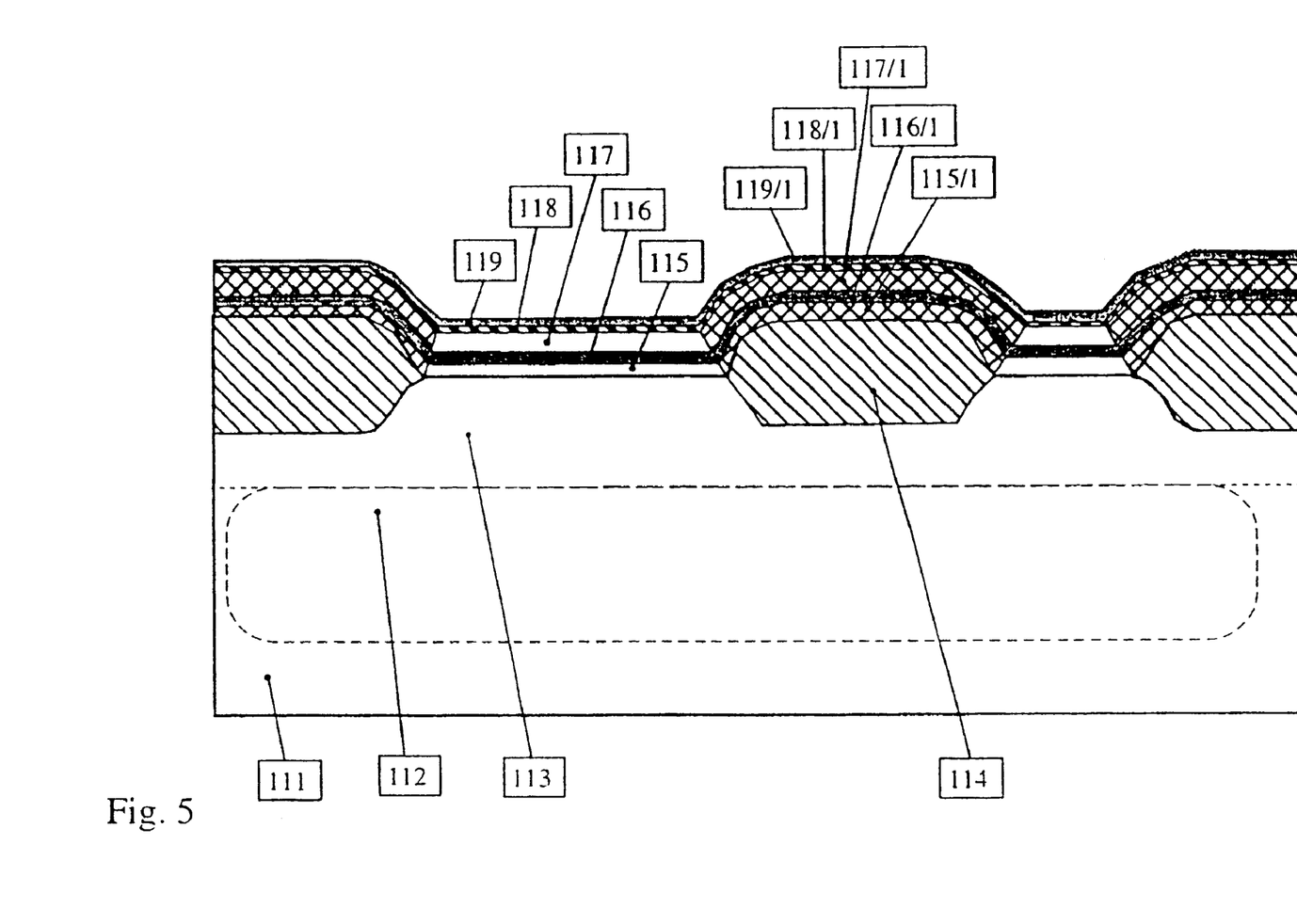
FIG. 5 is a schematic presentation of a bipolar transistor in accordance with FIG. 4 before epitaxy.

The fabrication of the bipolar transistor 100 shown in FIG. 4 will be described hereafter. The process steps in the second embodiment up to the differential epitaxy are identical to the steps of the first embodiment. Instead of the layer sequence described in the first embodiment, the process continues with the following stack of layers: The buffer layer 115, 115/1 and base layer 116, 116/1 are followed by a weakly doped intermediate layer 117, 117/1, and etch stop layer 118, 118/1 as well as a cover layer 119, 119/1. Monocrystalline growth occurs in the silicon region and polycrystalline growth occurs in the insulating region. The process steps proceed from the structure shown in FIG. 5.

After photolithographically structuring a mask the precipitated silicon or poly-silicon layers outside of the subsequent transistor and base connection regions are removed by a plasma etching step with an etch stop on the insulating region 114. A subsequently applied dielectric material 120 (FIG. 6), e.g. 50 nm oxide, is initially opened in the emitter region by common lithographic and wet etching processes.

Figure 6:
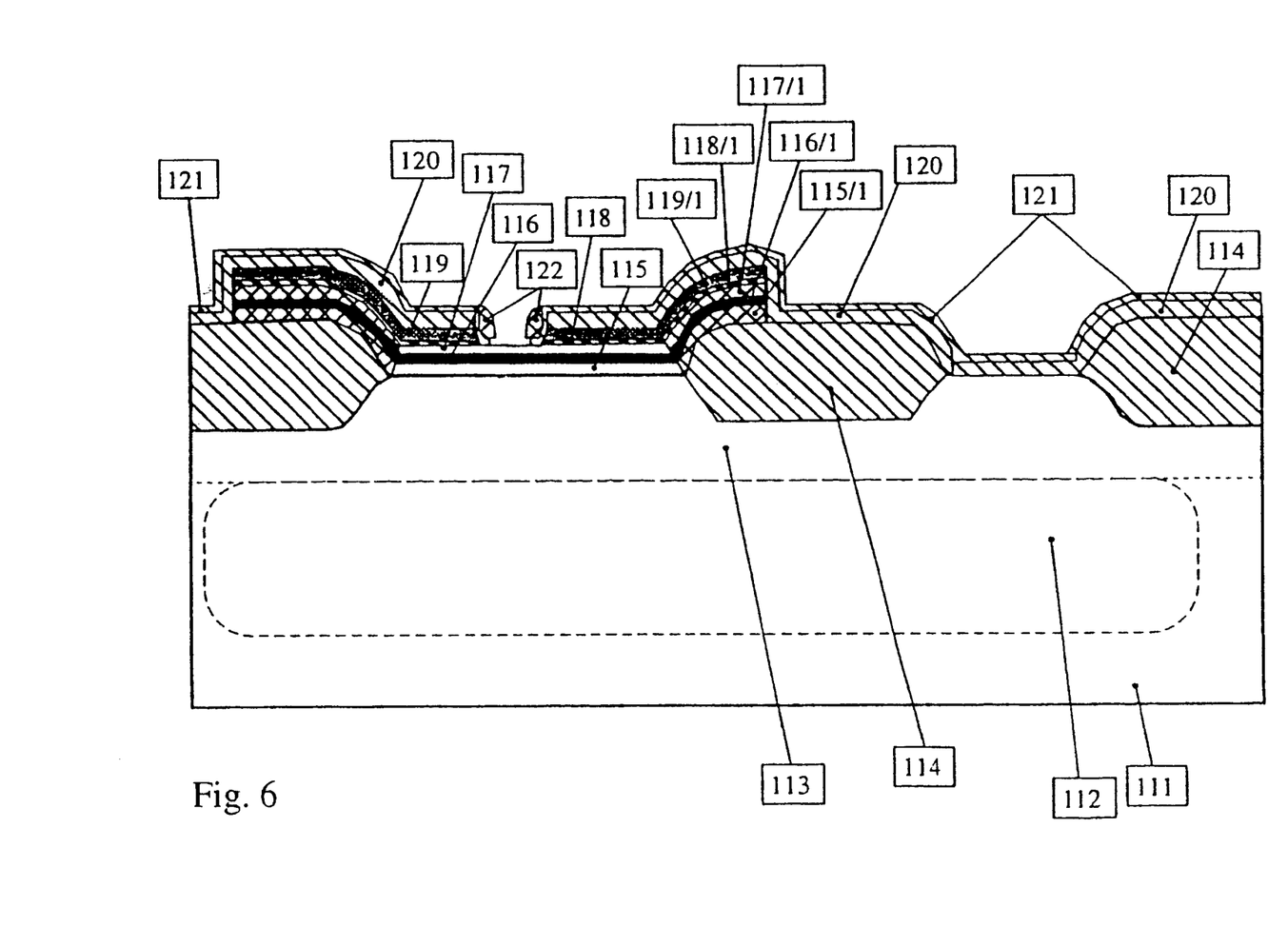
FIG. 6 is a schematic presentation of a bipolar transistor in accordance with FIG. 4 during fabrication.

The cover layer 119 is completely removed down to the etch stop layer 118 by means of conventional wet-chemical etching agents of the kind capable of removing a boron doped silicon layer in a controlled and sufficiently select manner with respect to the underlying etch stop layer or $SiO_2$. There is no need for selectivity with respect to the cover layer exposed at the side walls. Thereafter, a double layer consisting of 20 nm $SiO_2$ and 100 nm amorphous silicon is precipitated. Inside spacers are formed following a plasma etching step with an etch stop on the last-precipitated oxide layer. The silicon surface will thereafter be exposed by a wet-chemical etching step.

This leads to the formation of the surface relief shown in FIG. 6. The collector connection region is then opened by photolithographically structuring of a lacquer mask, and the buried implant is incorporated. Prior to removing this lacquer mask the oxide layers 120, 121 in the collector connection region are preferably wet-chemically etched. To fabricate a complete transistor, the process is then continued as in the first embodiment.

A bipolar transistor and a method of its fabrication has been described in the present invention on the basis of concrete embodiments. It is to be mentioned, however, that the present invention is not limited by the details of the embodiments in the description as changes and variations are being claimed within the scope of the patent claims.

What is claimed is:

1. A method of fabricating a bipolar transistor, comprising the steps of:

forming on a monocrystalline substrate layer structured regions comprising a collector region and insulating regions surrounding a transistor region;

simultaneously precipitating a monocrystalline layer sequence including a base layer and a polycrystalline layer sequence over the collector region and insulating regions, respectively;

precipitating as part of the simultaneous precipitation a cover layer over the base layer; and at least partially removing the cover layer in an emitter region; and forming a surface relief by wet-chemical etching in an active emitter region.

2. The method of claim 1, further including the step of applying a mask and using highly selective chemical etching for removing monocrystalline semiconductor material from the active emitter region.

3. The method of claim 1, further including the steps of placing a nitride mask over the base and cover layers, opening the mask above the emitter, converting the cover layer to oxide by thermal oxidation and highly selectively removing the oxide relative to the mask by wet chemical etching.

4. The method of claim 1, further including the step of incorporating one of doping and hetero layer sequence in the cover layer over the base layer.

5. The method of claim 4, wherein the doping and hetero layer sequence serves as an etch stop for the wet-chemical etching and further including the optional step of removing the etch stop by additional chemical etching.

6. The method of claim 1, further including the step of incorporating one of carbon and oxygen in the base layer doping for inhibiting diffusion therefrom.

7. The method of claim 1, wherein the base layer is p-doped at a concentration of less than $5 \cdot 10^{18}$ cm$^{-3}$ and further comprising the steps of forming a weaker doped intermediate layer on the base layer;

forming an etch stop layer consisting of silicon doped at a boron concentration higher than $1.5 \cdot 10^{19}$ cm$^{-3}$ forming a cover layer of a boron concentration less than $1.5 \cdot 10^{19}$ cm$^{-3}$ on the etch stop layer;

partially masking and completely removing the etch stop layer and the cover layer from an active emitter region; and forming an inside spacer by precipitation of a double layer; and exposing the intermediate layer by wet-chemical etching.

8. A bipolar transistor with structured regions on a monocrystalline substrate layer comprising a collector region and insulating regions surrounding the collector region and a monocrystalline layer sequence disposed above the collector region, wherein the monocrystalline layer sequence comprises a base layer and a cover layer superposed thereon, wherein the cover layer is at least partially removed in an emitter region.

9. The bipolar transistor of claim 8, wherein the cover layer is precipitated to a thickness of between 50 nm and 200 nm.

10. The bipolar transistor of claim 8, wherein the cover layer comprises a re-etched portion having a thickness of between 30 nm and 60 nm.

11. The bipolar transistor of claim 8, wherein the base layer is doped at a concentration of less than $1.5 \cdot 10^{18}$ cm$^{-3}$ and the cover layer is doped at a concentration lower than the base layer.

12. The bipolar transistor of claim 8, wherein above the base layer there is arranged a layer combination comprising an intermediate layer, an etch stop layer and a cover layer, the cover layer being removed in the active emitter region and the etch stop being thinner in the active emitter region than outside thereof.

13. The bipolar transistor of claim 12, wherein one of carbon and oxygen is incorporated in the base layer.

14. The bipolar transistor of claim 12, wherein the precipitated thickness of the intermediate layer is between 30 nm and 60 nm.

15. The bipolar transistor of claim 12, wherein the intermediate layer is doped at a dopant concentration of less than the $5 \cdot 10^{18}$ cm$^{-3}$ concentration of the base.

16. The bipolar transistor of claim 12, wherein the precipitated thickness of the etch stop layer is between 3 nm and 20 nm.

17. The bipolar transistor of claim 12, wherein the precipitated thickness of the cover layer is between 30 nm and 150 nm.

18. The bipolar transistor of claim 12, wherein the etch stop layer consists of a material selected from the group consisting of SiGe and SiC.

19. The bipolar transistor of claim 12, wherein a pair of inside polysilicon spacers is provided between one of the etch stop layer and cover layer and a polysilicon contact layer.

20. The bipolar transistor of claim 12, wherein one of the etch stop layer and cover layer consists of a silicon layer highly doped by the base.

21. The bipolar transistor of claim 12, wherein the base is p-conductive, the etch stop layer is doped with boron at a concentration in excess of $1.5 \cdot 10^{19}$ cm$^{-3}$, and the cover layer is doped with boron at a concentration less than $1.5 \cdot 10^{19}$ cm$^{-3}$.

* * * * *